United States Patent [19]

Hartemann et al.

[11] Patent Number: 4,472,692
[45] Date of Patent: Sep. 18, 1984

[54] TUNABLE SELECTIVE DEVICE USING MAGNETOSTATIC BULK WAVES

[75] Inventors: Pierre Hartemann; Jean P. Castera; Jean M. Dupont, all of Paris, France

[73] Assignee: Thomson-CSF, Paris, France

[21] Appl. No.: 426,908

[22] Filed: Sep. 29, 1982

[30] Foreign Application Priority Data

Dec. 31, 1981 [FR] France ............................ 81 24561

[51] Int. Cl.³ .......................... H03H 9/00; H03H 9/24
[52] U.S. Cl. ...................................... 333/147; 310/26; 333/24.1; 333/149; 333/186
[58] Field of Search ........ 333/141, 147, 148, 150–155, 333/193–196, 24.1, 186; 331/107 A; 330/4.6; 310/26

[56] References Cited

U.S. PATENT DOCUMENTS 4,318,061 3/1982 Castéra et al. .................. 331/107 A

FOREIGN PATENT DOCUMENTS 0022700 1/1981 European Pat. Off. .
2290786 6/1976 France .

OTHER PUBLICATIONS

IEEE MTT-S International Microwave Symposium Digest, 1979, N.Y. (U.S.) J. M. Owens et al., pp. 154–156.
IEEE MTT-S International Microwave Symposium Digest, 1979, N.Y. (U.S.) J. D. Adam, pp. 160–161.
Nachrichten Elektronick, vol. 34, No. 8, Apr. 1980, Heidelberg (Germany) P. Schmitt, pp. 263–266.
Ultrasonics Symposium Proceedings, 26–28, Sep. 1979, New Orleans (U.S.), R. L. Rosenberg et al., pp. 836–840.

Primary Examiner—Marvin L. Nussbaum
Attorney, Agent, or Firm—Oblon, Fisher, Spivak, McClelland & Maier

[57] ABSTRACT

Tunable selective devices utilizing forward magnetostatic bulk waves. A filter is able to act as an oscillator loop or as a passive transmission system in which two resonant cavities including gratings are so arranged that via a selective reflector grating they may exchange magnetostatic bulk waves energized and intercepted by transducers of the microstrip type. The invention relates in particular to the filtering of very high frequency electric signals, and to the production of tunable oscillators and to measuring magnetic fields.

16 Claims, 6 Drawing Figures

TUNABLE SELECTIVE DEVICE USING MAGNETOSTATIC BULK WAVES

BACKGROUND OF THE INVENTION

The present invention relates to tunable selective devices based on the transmission and reception of forward magnetostatic bulk waves. These waves are commonly propagated by a magnetic layer deposited on a non-magnetic substrate. The selective characteristics are obtained by forming resonant cavities in the surface of the magnetic layer, which are delimited by gratings of grooves or of filamentary areas exposed to an ionic implantation. The cascade wave coupling of two resonant cavities each provided with a microstrip, makes it possible to transmit, in a selective manner, a high frequency electric signal within a very narrow frequency range. This range may be shifted to establish a tuned condition, by altering the intensity of a magnetic field directed at right angles to the plane of the magnetic layer.

The forward magnetostatic bulk waves have isotropic propagation characteristics in the plane of the magnetic layer and, compared to the magnetostatic surface waves, they offer the advantage of a higher saturation level. If it is intended to produce a tunable selective device by placing a transmitting microstrip and a receiving microstrip in a resonant cavity, it may well be possible to obtain a resonance peak at a given frequency, but the direct coupling established between the microstrips has the result that the insertion losses observed close to resonance are barely greater than those observed at the apex of the resonance peak.

If two resonant cavities delimited by parallel reflectorgratings and each equipped with a microstrip are arranged in cascade, a common mode may be isolated by filtering, so that a single resonance peak may be observed within a substantial range of frequencies. Nevertheless, the insertion losses at either side of this resonance peak have a comparatively small drop from the apex of the resonance peak. This leads to inadequate decoupling between the microstrips for the frequencies differing from the resonance frequency.

The unidirectional character of the propagation of the magnetostatic surface waves makes it possible to secure a more satisfactory reduction of the insertion losses at frequencies outside resonance, but at the cost of a power limitation and of a positive temperature drift, which are more difficult to balance.

In order to reduce the aforesaid disadvantages whilst securing a sensible drop in the insertion losses at frequencies other than at resonance, the invention proposes the application of forward magnetostatic bulk waves whilst exploiting the omnidirectional nature of these waves, to provide a satisfactory level of saturation at low frequencies and greater ease in compensating thermal drift. The device obtained may operate as a filter as well as a loop in an oscillator arrangement.

SUMMARY OF THE INVENTION

The invention provides a tunable selective device utilising magnetostatic bulk waves, comprising a magnetic layer carried by a non-magnetic substrate, means for polarizing the said layer perpendicular to its exposed surface, two resonant grating cavities formed in the said magnetic layer and two microstrips arranged respectively in the said resonant cavities, in order to form the electric input and output sides of the said device, characterised in that the rsspective axes of the said resonant grating cavities intersect in a region of the said layer in which is situated an energy reflector grid of which the elements are arranged to reflect a maximum level of the incident energy at the tuned frequency of the device.

BRIEF DESCRIPTION OF THE DRAWINGS

A better understanding of the invention will be obtained from the following description and the accompanying drawings, in which.

DESCRIPTION OF THE PREFERRED EMBODIMENTS

Figure 1:
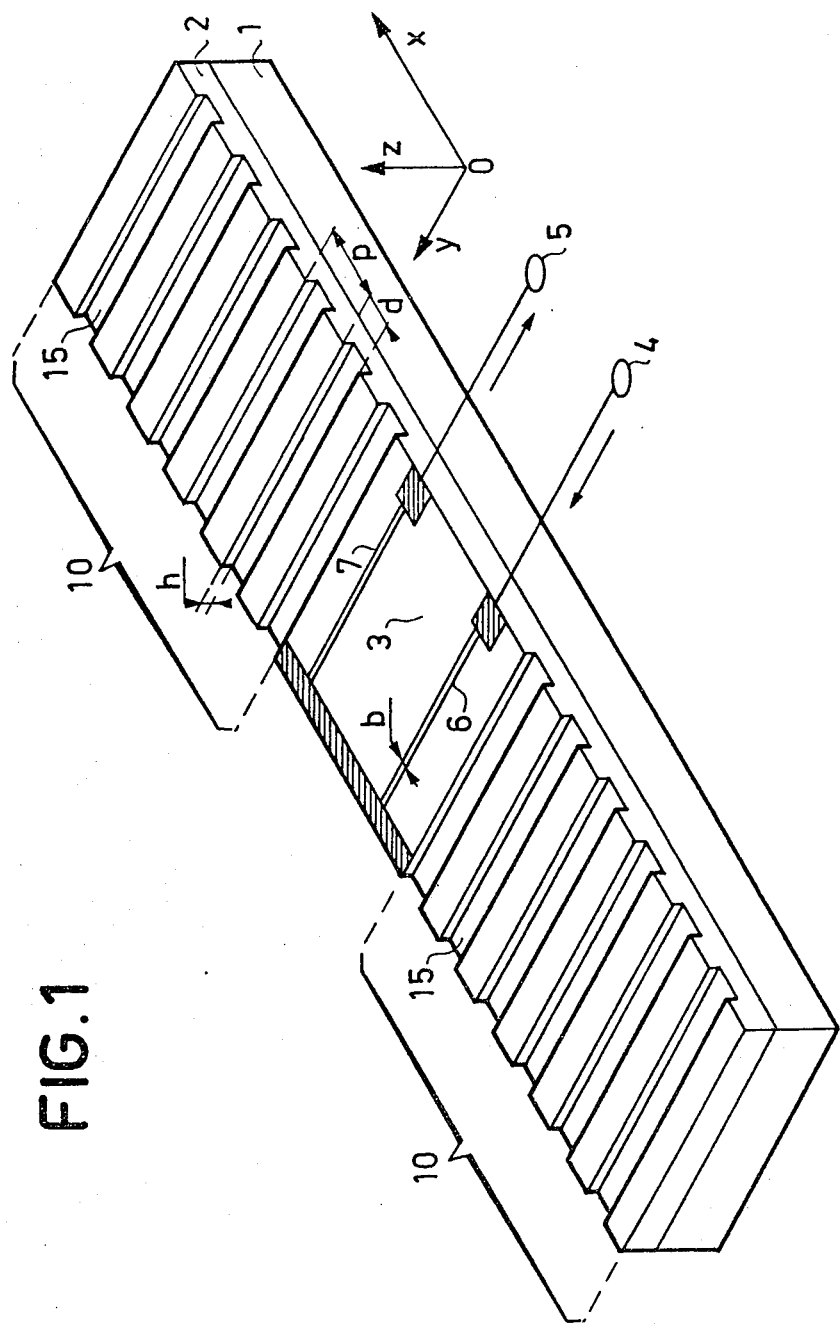
FIG. 1, is an isometric view of a tunable selective magnetostatic wave device of known type.

FIG. 1 shows a resonator comprising two ports 4 and 5 based on the energization and interception of magnetostatic waves.

This device comprises, for example, a non-magnetic substrate 1 of gadolinium and gallium garnet (GGG) the surface of which has deposited on it by epitaxy in the liquid phase a magnetic layer 2 of yttrium and iron garnet (YIG). A trirectangular marking Oxyz is shown in FIG. 1 with its oxy plane parallel to the exposed surface of the layer 2. A typical thickness for the magnetic layer 2 is 22 microns. Magnetic inductor means, not shown in FIG. 1, subject the magnetic layer 2 to a magnetic polarizing field directed parallel to the axis z.

Under these conditions, it is known that the layer 2 may act as a medium for the propagation of forward magnetostatic bulk waves (OMVF). The characteristics of these waves are identical for all directions of the plane xoy and depend on the intensity of the magnetic polarizing field. A rectilinear conductive microstrip 6 connecting the port 4 to an earth connection is traversed by a high frequency current and, since it is deposited on the surface 3 of the layer 2, it generates the transmission of magnetostatic waves having rectilinear wavefronts in the positive and negative directions of the axis x. The magnetostatic waves transmitted interact with two gratings 10 of which the lines 15 are directed parallel to the axis oy.

By way of non-limiting example, the lines 15 in FIG. 1 are actually grooves formed in the magnetic layer 2 by ionic etching. The task of these lines being to establish an impedance mismatch intended to reflect the magnetostatic waves locally. It may equally be envisaged to establish areas modified by ionic implantation or to cover the layer 2 with a non-magnetic support equipped with a grating of conductive bands inducing a similar reflective action. The pitch p of the gratings 10 is chosen as a function of the wavelength $\lambda$ of the magnetostatic waves. For a value $\lambda_o$, each grating 10 provides overall the maximum reflectivity if $2p$ equals $k\lambda_o$, with k equal to 1,2,3, ... etc. The width d of a line of the grating 15 establishes the ratio d/p. This ratio may be modified to reduce the reflectivity of the grating to a submultiple wavelength of that for which maximum reflectivity is required. In the case of FIG. 1, it may be assumed, for example, that p equals $\lambda_o/2$ which is equivalent to imposing a magnetostatic wave frequency f(H) for each intensity of the magnetic field H for polarization of the layer 2.

Figure 2:
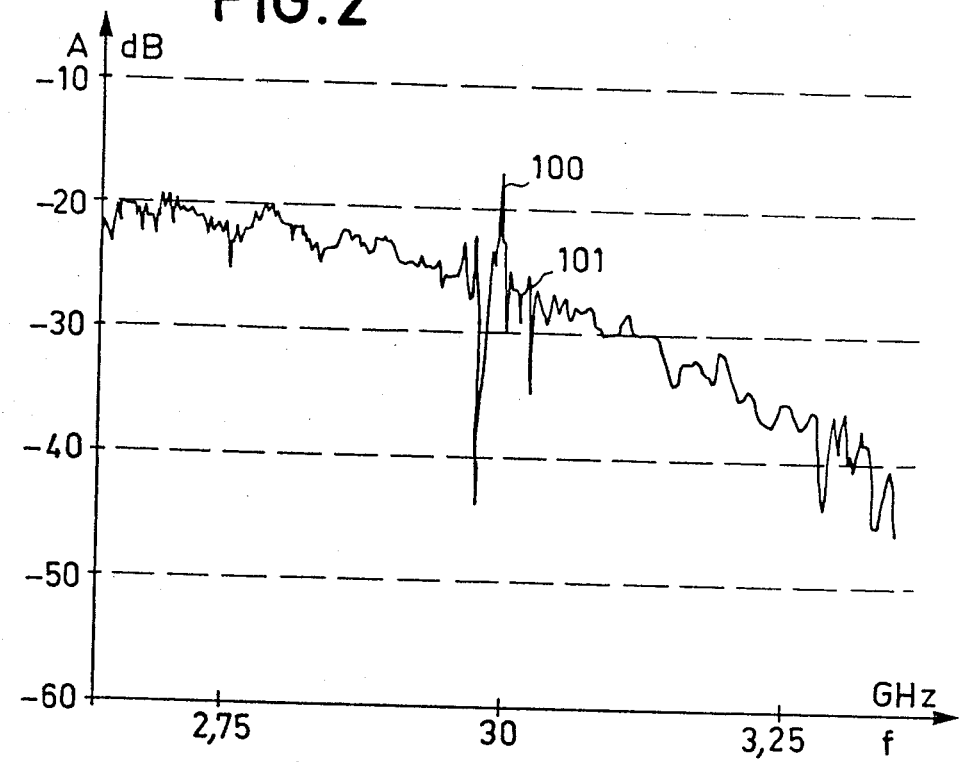
FIGS. 2 and 3, are explanatory diagrams.

In FIG. 1, the gratings 10 delimit a resonance cavity in which the microstrip 6 generates a system of standing waves at the frequency f(H) referred to above. By placing in this cavity a conductive microstrip 7 which connects the earthing point to the port 5, an electric current is made available whose intensity is a maximum for this frequency. This intensity corresponds to a resonance peak caused by the properties of the cavity, but the rejection effect of frequencies other than resonance frequencies is no more than 3 to 4 dB as shown by FIG. 2. The graph 101 of FIG. 2 illustrates the transfer characteristics for a set value of the magnetic polarizing field. This graph gives the insertion losses A as a function of the frequency f of the electric signal transmitted between the ports 4 and 5. It will be noted that the resonance peak 100 is flanked by areas in which the insertion losses are increased but a little. This results partially from the direct coupling between the microstrips 6 and 7 and partially from the fact that the gratings become ever less reflective upon moving away from the resonance frequency. By way of indication, FIG. 1 shows the width b of the microstrips which may be of the order of 10% of the wavelength and the depth h of the grooves 15 which is of the order of 1% of the thickness e of the magnetic layer.

Figure 3:
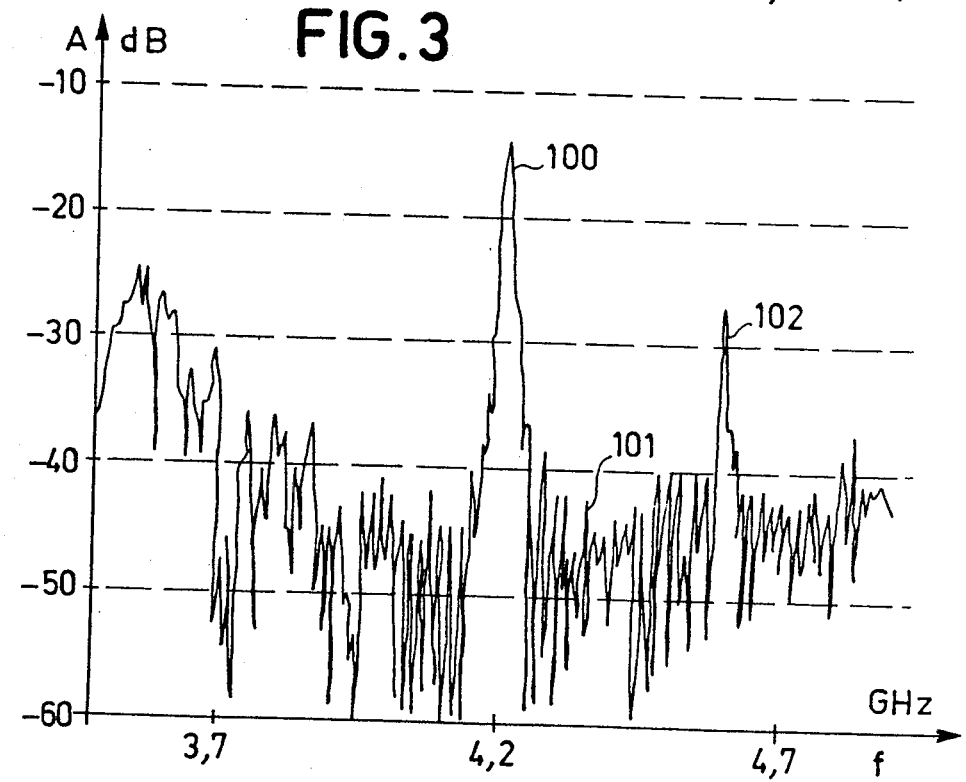

In order to obtain an improved transfer characteristic according to FIG. 3, the invention proposes to employ two resonance cavities of which each is equipped with a single microstrip and the exchange between these cavities of forward magnetostatic bulk waves which are reflected selectively and under oblique incidence by an intermediate grating.

Figure 4:
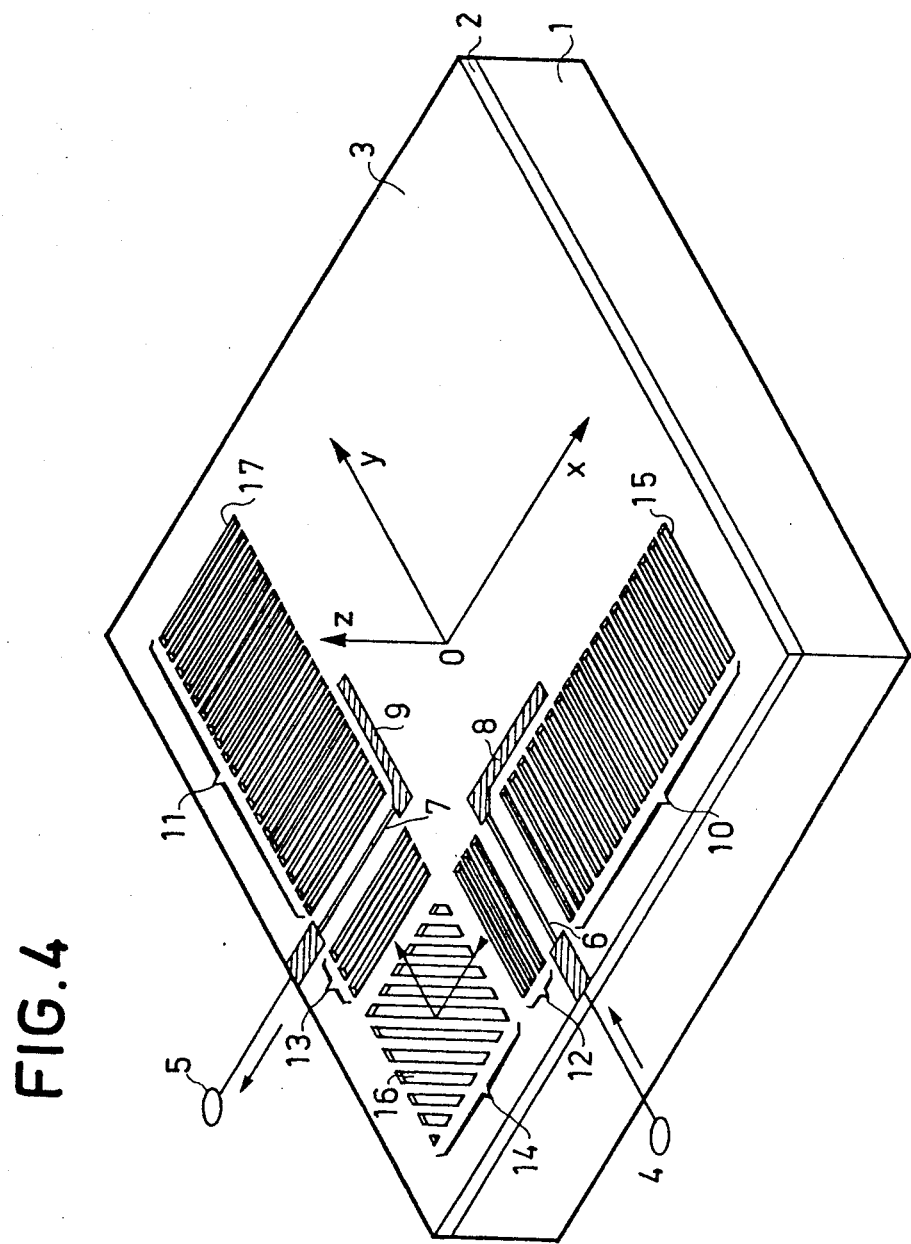
FIG. 4, is a partial isometric view of an embodiment of the device according to the invention.

The central part of a device according to the invention can be seen from FIG. 4. The same reference denote the same elements as in FIG. 1.

The microstrip 6 is housed in a resonance cavity delimited by a reflector grating 10 and a partially reflective grid 12. The axis of this cavity is parallel to ox. The microstrip 6 is connected to a metallization 8 forming a terminal electric charge or load. The microstrip 7 is located in another resonance cavity delimited by a reflector grating 11 and a partially reflective grating 13. A metallization ation 9 acts as a terminator for the microstrip 7. The grooves 17 form the lines of the grating 11 and of the grating 13. This other resonance cavity has its axis parallel to the axis oy. The two resonance cavities are arranged in such a manner that their axes intersect in an area wherein extends a grating 14 formed by rectilinear lines 16 parallel to the external bisector of the angle xoy. There is no need for the angle xoy to be a right angle.

The grating 14 simultaneously serves the purpose of coupling and decoupling. If the magnetostatic wave frequency is that selected by the two resonant cavities 10–12 and 11–13, the grating 14 is dimensioned for optimum reflection of the wave issuing from the grating 12 to reflect these towards the grating 13. This mode of operation establishes a resonance peak 100 with a minimum insertion loss at its centre. If the frequency of the magnetostatic waves deviates from this condition, the grating 14 performs effective decoupling of the resonance cavities 10–12 and 11–13.

Figure 6:
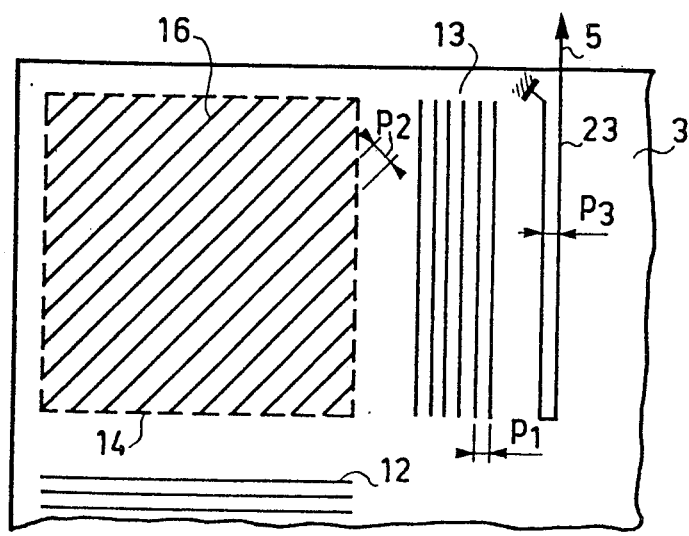
FIG. 6, is a plan view of a fragment of a board as shown in FIG. 4.

As a matter of fact, the major proportion of the energy issuing from the cavity 10–12 tends to pass the grating 14 without undergoing the change in direction illustrated in FIG. 4 at the location of the grating 14. This provides an appreciable increase of the insertion losses at either side of the resonance peak 100, as shown in FIG. 3. This insertion loss increase is such that the harmonic resonance 102 becomes visible in FIG. 3, but this undesirable peak may be counteracted by appropriate selection of the form factor d/p or by replacing the microstrips 6 and 7 by pin transducers as illustrated in FIG. 6. FIG. 6 is a plan view diagrammatically showing the principal dimensions to be adhered to in an embodiment.

Purely by way of illustration, the transfer function shown in FIG. 3 was obtainable from a GGG substrate on which a YIG layer of 22 microns was caused to grow by epitaxy in the liquid phase. Aluminium was deposited on this layer 2 by spraying so as to form the microstrips 6 and 7 having the width b of 30 microns. The gratings 10 and 11 are formed by ionic machining to secure a reflective capacity of maximum value at the wavelength λ of 300 microns. They comprise 50 grooves, each having an h/e ratio of 0.8% and a pitch $p_1$ of 150 microns. These values correspond to an absorption of −22 dB in transmission, or if the losses are ignored, to an amplitude reflection coefficient R of 99.7%.

The intermediate reflector grating 14 operates under oblique incidence and should have a pitch $p_2$ greater than the pitch $p_1$. Assuming the axes of the two cavities to subtend an angle θ, the pitch $p_2$ of the grid 14 is given by the relationship $$p_2 = (\lambda/2 \cos \theta/2)$$

in which λ is the wavelength at which the Bragg reflection is a maximum.

With λ=π/2 and λ=300 microns, $p_2$ is found to be 212 microns. For example, the grating 14 will comprise 20 grooves having a relative depth h/e of 0.8%, corresponding to an absorption of −8.75 dB and to an amplitude reflection coefficient R=93.1%. This leaves the gratings 12 and 13 which are formed in each case by 10 grooves having a pitch $p_1$ of 150 microns, with a relative depth h/e of 0.8%. The absorptive capacity of the grating 12 or the grating 13 is −4.4 dB, say a reflection coefficient R of 79.8% and a transmission factor T of 60.2%. The transmission factor of the pair of gratings 12 and 13 is equal to 36.3% in this case.

The graph of FIG. 3 applies to this numeric example. The minimum insertion losses amount to 14 dB, the quality factor is 350 and the rejection of the frequencies beyond resonance is 23 dB.

By replacing the microstrips 6 and 7 of FIG. 4 with the transducer 23 of FIG. 6 which is formed by a folded dipole having a pitch $p_3$ of λ/2, it is possible to cause the resonance 102 to disappear and to increase the insertion losses at low frequencies.

Figure 5:
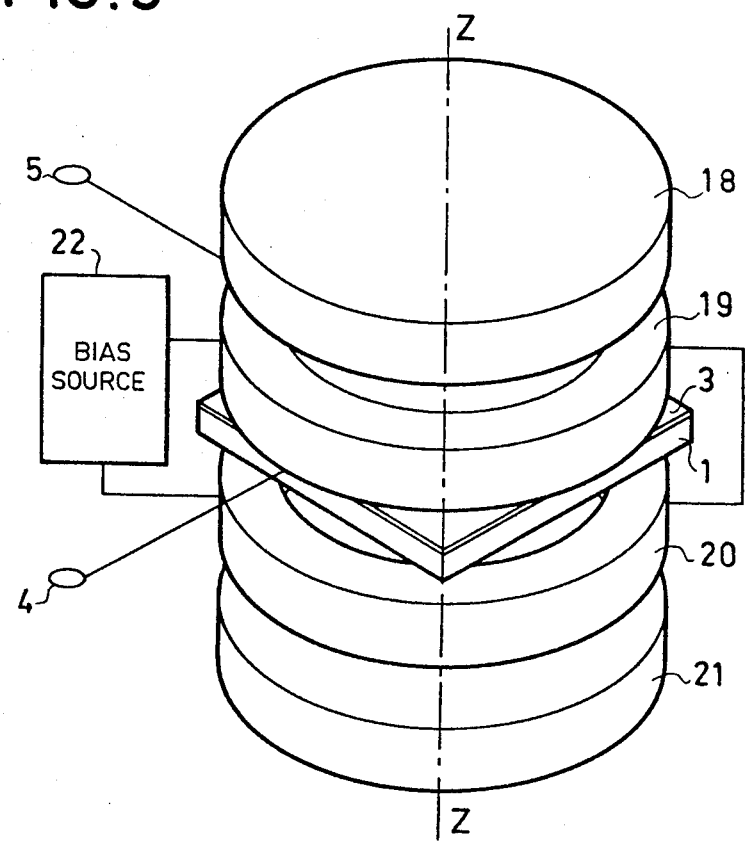
FIG. 5, is an overall isometric view of the device according to the invention.

The complete device illustrated in FIG. 5 may be ultilised as a tunable filter or as a loop of a tunable oscillator. Apart from the elements of FIG. 4 of which the references 1,3,4 and 5 are repeated, it comprises two coils 19 and 20 on either side of the substrate 1. These coils form a Helmholtz coil system intended to genetate a uniform magnetic field for adjustment of the resonance frequency. The generator 22 feeds a current of adjustable intensity through the Helmholtz coils 19–20. Permanent magnets 18 and 21 are equally provided to establish a a permanent magnetization in a direction parallel to the axis ZZ. The thermal drift of the forward magnetostatic bulk waves is such that it may be balanced by the inherent thermal drift of the permanent magnets 18 and 21.

Without departing from the scope of the present invention, it is necessary to point out that the two resonance cavities may form the location for a greater or lesser number of standing wave modes and that one of these may be selected by adopting such cavity lengths that the other modes are rejected. It should also be pointed out that particular resonance cavities are formed by two joined together, the microstrip being placed between two grating lines towards the centre of the structure. Finally, the invention equally applies to a structure in which the grating elements would be incurved with respect to a centre instead of being rectlinear.

Thus, two resonant cavities having gratings of which the lines are incurving with a common centre situated in their extension, could co-operate with a reflector grating 14 whose lines would be formed by reflective spots arranged to provide maximum reflectivity at a predetermined wavelength.

By reason of the reduction of the insertion losses around the resonance peak, the device of the invention equally lends itself to the measurement of magnetic fields.

In conclusion, it is worth stating that the grating lines may be produced in the form of grooves by chemical attack on the magnetic layer through a resin mask. It is equally possible to envisage a selective chemical action following an ionic bombardment of the magnetic layer, which without a mask renders it possible to produce a raised engraving.

What is claimed is:

1. A tunable selective device using magnetostatic bulk waves, comprising;
   a non-magnetic substrate;
   a magnetic layer placed on said substrate and having an exposed surface;
   polarizing means for subjecting said layer to a magnetic polarizing field perpendicular to said exposed surface;
   first resonant cavity means formed in said layer including a first grating means having a first plurality of grating lines wherein the axis of said first resonant cavity means is defined as being perpendicular to the length of said first plurality of grating lines;
   first microstrip means associated with said first grating means on said layer;
   second resonant cavity means formed in said layer including a second grating means having a second plurality of grating lines wherein the axis of said second resonant cavity is defined as being perpendicular to the length of said second plurality of grating line;
   second microstrip means associated with said second grating means on said layer; and
   energy reflector grating means formed on said layer in an area defined as symmetrically surrounding the point of intersection of said axes of said first and second resonant cavity means in the plane of said layer wherein said energy reflector grating means includes elements which are arranged to cause optimum reflection of a wave issuing from said first resonant cavity means towards said second resonant cavity means.

2. Device according to claim 1, in which the gratings delimiting each of the said cavities are formed by straight parallel and equidistant lines, each of said cavities comprising:
   a termination reflector grating which reflects predetermined wave lenths; and
   a semi-reflector grating means which provides partial reflection of said predetermined wave lengths with said semi-reflector grating means being interposed between the said energy reflector grating and said termination reflector grating.

3. Device according to claim 1 or 2, in which the axes of the said cavities subtend an angle $\theta$ between them, the pitch $P_2$ of the said energy reflector grating is equal to $\lambda/2 \cos \theta/2$, in which $\lambda$ is the tuned wavelength of the said resonant cavities, and the elements of the said reflector gratings are aligned along the external bisector of the angle $\theta$.

4. Device according to claim 3, in which the angle $\theta$ is equal to $\pi/2$.

5. Device according to claim 1, in which the form factor d/p of the said gratings is chosen to increase the insertion losses at the submultiple wavelengths of the tuned wavelength $\lambda$ of the said cavities.

6. Device according to claim 1, in which the microstrips are folded in loop form having two rectilinear radiating elements spaced apart by $\lambda/2$.

7. Device according to claim 1, in which the said cavities have identical filtering characteristics.

8. Device according to claim 1 in which the said cavities have distinct multimodal filtering characteristics having a common resonance mode.

9. Device according to claim 1 in which the said polarizing means generate a magnetic field having an intensity adjustable around a rest value.

10. Device according to claim 9, in which the inherent thermal drift of the forward magnetostatic bulk waves is balanced by the thermal drift intrinsic to the said rest value.

11. Device according to claim 10, in which the said rest value is established by permanent magnets appertaining to the means of polarizing the layer.

12. Device according to claim 1, in which the non-magnetic substrate is a gadolinium and gallium garnet, the layer being an yttrium and iron garnet layer epitaxied in the liquid phase to the surface of the said suhstrate.

13. Device according to claim 1, in which the said gratings are produced by ionic machining of the surface of the said layer.

14. Device according to to claim 1, in which the said gratings are produced by ionic implantation of the said layer.

15. Device according to claim 14, in which a selective chemical attack provides the forming of raised grids.

16. Device according to claim 1, in which the said gratings are produced by chemical attack through a mask.

* * * * *